United States Patent
Taylor et al.

(10) Patent No.: US 10,150,665 B2
(45) Date of Patent: Dec. 11, 2018

(54) IN-PLANE-STRAIN-ACTUATED OUT-OF-PLANE ACTUATOR

(71) Applicants: The Board of Trustees of the Leland Stanford Junior University, Palo Alto, CA (US); Infinite Corridor Technology, LLC, Brooklyn, NY (US)

(72) Inventors: Rebecca Elizabeth Taylor, San Francisco, CA (US); Beth L. Pruitt, San Francisco, CA (US); Mary C. Boyce, New York, NY (US); Christopher M. Boyce, New York, NY (US)

(73) Assignees: The Board of Trustees of the Leland Stanford Junior University, Stanford, CA (US); Infinite Corridor Technology, LLC, Brooklyn, NY (US)

( * ) Notice: Subject to any disclaimer, the term of this patent is extended or adjusted under 35 U.S.C. 154(b) by 1267 days.

(21) Appl. No.: 14/216,063

(22) Filed: Mar. 17, 2014

(65) Prior Publication Data

US 2016/0158933 A1 Jun. 9, 2016

Related U.S. Application Data

(60) Provisional application No. 61/799,680, filed on Mar. 15, 2013.

(51) Int. Cl.
*B81B 3/00* (2006.01)
*G02B 26/08* (2006.01)

(52) U.S. Cl.
CPC ........ *B81B 3/0048* (2013.01); *G02B 26/0825* (2013.01); *G02B 26/0833* (2013.01);
(Continued)

(58) Field of Classification Search
CPC ..... B81B 3/00–3/0097; B81B 2201/06; B81B 2201/042; B81B 2201/038;
(Continued)

(56) References Cited

U.S. PATENT DOCUMENTS

3,265,117 A * 8/1966 Anderle .................... E06B 9/28
160/174 R
8,084,117 B2 12/2011 Lalvani
(Continued)

*Primary Examiner* — Zachary Wilkes
(74) *Attorney, Agent, or Firm* — Kaplan Breyer Schwarz, LLP (57) ABSTRACT

A micromechanical device capable of providing out-of-plane motion and force generation in response to an in-plane strain applied to the device is provided. Embodiments of the present invention comprise one or more islands that are operatively coupled with one or more hinges. The hinges are operative for inducing rotation of the islands when a lateral strain is applied to the structure. In some embodiments, the hinges are also electrically conductive such that they enable electrical communication between the one or more islands and devices external to the structure. Some embodiments of the present invention are particularly well suited for use in biological applications. Some devices in accordance with the present invention are fabricated using conventional planar processes, such as flex-circuit fabrication techniques.

18 Claims, 11 Drawing Sheets

(52) U.S. Cl.
CPC ... *B81B 2201/038* (2013.01); *B81B 2201/042* (2013.01); *B81B 2201/06* (2013.01); *B81B 2203/058* (2013.01); *B81B 2203/06* (2013.01)

(58) Field of Classification Search
CPC .......... B81B 2203/058; B81B 2203/06; B81B 26/0825; B81B 26/0833
USPC ........... 359/226.2, 290, 224.1, 291; 428/134, 428/136; 160/174 R, 254
See application file for complete search history.

(56) References Cited

U.S. PATENT DOCUMENTS

| | | |
|---|---|---|
| 2010/0096729 A1 | 4/2010 | Wong et al. |
| 2010/0308206 A1* | 12/2010 | Tomlinson ................ F24J 2/08 250/203.1 |
| 2010/0330338 A1 | 12/2010 | Boyce et al. |
| 2011/0205608 A1* | 8/2011 | Mizoguchi ........... G02B 26/085 359/198.1 |

* cited by examiner

IN-PLANE-STRAIN-ACTUATED OUT-OF-PLANE ACTUATOR

STATEMENT OF RELATED CASES

This case claims priority to U.S. Provisional Patent Application Ser. No. 61/799,680 filed on Mar. 15, 2013, which is incorporated herein by reference.

STATEMENT REGARDING FEDERALLY SPONSORED RESEARCH

This invention was made with Government support under contract 1136790 awarded by the National Science Foundation and under contract 0735551 awarded by the National Science Foundation. The Government has certain rights in the invention.

FIELD OF THE INVENTION

The present invention relates to microsystems in general, and, more particularly, to sensors and actuators for biocompatible microsystems.

BACKGROUND OF THE INVENTION

Micro Electro Mechanical Systems (MEMS) technology has enabled the development of numerous small actuators and sensors, which have found use across myriad applications. Due, in part, to the fabrication technologies employed to fabricate these devices, the bulk of MEMS actuators developed have been "in-plane" devices. An in-plane device is one whose response is along a direction parallel to the substrate on which it is formed. The development of devices that operate "out of plane," particularly actuators, has been limited. Those "vertical" actuators that have been developed typically have had a limited range of motion and, as a result, widespread adoption of vertical actuators remains unrealized.

In many applications, however, vertical actuation or force generation can provide significant advantages, such as smaller required chip real estate, an ability to form large arrays, and broader operational capability. Pop-up, fold-out, and deformable structures are seen as particularly attractive in applications such as tunable RF devices, rotatable mirrors for redirecting light beams, tactile feedback systems, and deformable mirrors for adaptive optics.

Typically, vertical actuation has relied on either electrostatic or thermal actuators, such as vertical comb drives or thermal bimorph elements. A vertical comb drive includes two sets of electrodes that partially interleave and are vertically offset from one another, where one of the sets is operatively coupled with a movable element. When a voltage is applied between the sets of electrodes, a high electric field is generated and the movable set of electrodes attempts to move into vertical alignment with the stationary set thereby giving rise to motion of the movable element.

A thermal actuator typically includes a bimorph structure that has elements of different materials with different thermal expansion coefficients. One end of the thermal actuator is normally free to move relative to the other end. Upon heating or cooling, the different expansion of the materials gives rise to a bending force along the length of the bimorph moving the free end away from or toward the substrate on which they are formed.

Unfortunately, in some applications, it is undesirable to generate high electric fields or regions of localized heat. In biomedical applications, for example, sensitive tissue can be damaged or destroyed by heat or high electric fields. Further, conventional MEMS technology is often difficult to employ in a biological application because of material incompatibilities—particularly for implantable devices that must operate in-vivo for extended periods of time. As a result, it is necessary to package such devices to limit the exposure of the MEMS materials to the biological environment and visa-versa. Such packaging increases overall cost and can degrade device performance in many cases.

SUMMARY OF THE INVENTION

The present invention exploits the potential of flex-circuit technology to enable micromechanical devices that exhibit out-of-plane behavior as a pure mechanical response to in-plane strain. Embodiments of the present invention are particularly well suited for use in devices and systems such as biological sensors and actuators, microgrippers, stretchable electronics, controlled contact-force devices, tunable optical systems, strain sensors, and self-assembled microsystems.

Embodiments of the present invention are capable of providing out-of-plane motion and force generation, but are fabricated using conventional planar processes, such as flex-circuit fabrication techniques. Since flex-circuits can be biocompatible, some embodiments are well suited for use in implantable sensors and actuators, as well as other biological applications.

An illustrative embodiment is an actuator comprising a substantially rigid island that is mechanically connected between sets of hinge elements. In the absence of an applied strain, the hinge elements and the island are substantially coplanar in a first plane. When strain is applied to the actuator along its longitudinal axis, strain develops primarily in the hinge elements. The strain in the hinge element gives rise to a rotational force on the island that rotates it out of the first plane. The magnitude of the rotation and the force generated by the island are based on the design of the hinges and the magnitude of applied strain. In some embodiments, island rotation begins only when the magnitude of the applied strain exceeds a predetermined threshold level.

In some embodiments, at least one of the hinges includes an electrically conductive core that enables electrical communication with one or more elements disposed on the island.

In some embodiments, a plurality of islands is included within a chain such that each island is located between a pair of hinges. In some of these embodiments, the hinges are designed such that at least one island rotates at a different rate than another island. In some embodiments, the hinges are designed such that at least one island begins its rotation at a different threshold strain than another island.

In some embodiments, an actuator includes an island that can generate a controllable force.

In some embodiments, one or more islands comprise an end effector, such as a barb, suitable for facilitating adhering a device to a surface. In some embodiments, the end effector is suitable for adhering the device to biological tissue, such as skin.

An embodiment of the present invention comprises a first island that is substantially rigid; and a first hinge that is mechanically coupled with the first island; wherein the first island and the first hinge are co-planar in a first plane when the actuator is in an unactuated state, and wherein the first hinge is operative for rotating the first island out of the first

DETAILED DESCRIPTION

For many years, flex circuits have been used in applications where it is necessary to provide electrical connectivity to a moving component, electrically connect electronics located on different planes, and where small packaging size and/or low weight are important.

Flex circuits are typically formed of electrically conductive traces disposed on a flexible material, such as polymer. While traditional flex circuits were deformable out of plane, they were not stretchable. In many applications, however, stretchability is a desirable characteristic. For example, flexible, stretchable interconnects are well suited for integration with compliant biological tissues. For applications such as implantable sensors for in-vivo, long-term heart or brain monitoring or electrophysiological studies in biomimetic environments, wearable electronic devices, and the like, therefore, circuitry that could both flex and stretch would afford significant advantages.

As disclosed in U.S. Patent Publication 20100330338, which is incorporated herein by reference, a conventional flex circuit can be perforated to define substantially non-stretchable domains located between stretchable strain-relief regions. Such a structure enables in-plane strain applied to the device to be concentrated primarily in the strain-relief regions. As a result, electronics (or other strain-sensitive devices) mounted in the non-stretchable domains are substantially isolated from the applied strain. By limiting the strain applied to the flex circuit below a threshold level, planarity of the flex circuit can be maintained and the amount of strain induced on the electronics can be kept to an acceptable level.

It is an aspect of the present invention that when an in-plane strain is applied to such a structure, the mechanical response in the strain-relief regions gives rise to a rotational force on the domains, thereby causing them to rotate out of plane. Another aspect of the present invention is that the onset of rotation occurs at a threshold level of in-plane strain and can be controlled through design of the strain-relief regions. As a result, the present invention enables an actuator that actuates without the need for an electrical or thermal control signal, as well as strain sensors whose output signal is based on the rotation of the domains.

Figures 1A, 1B, 1C:
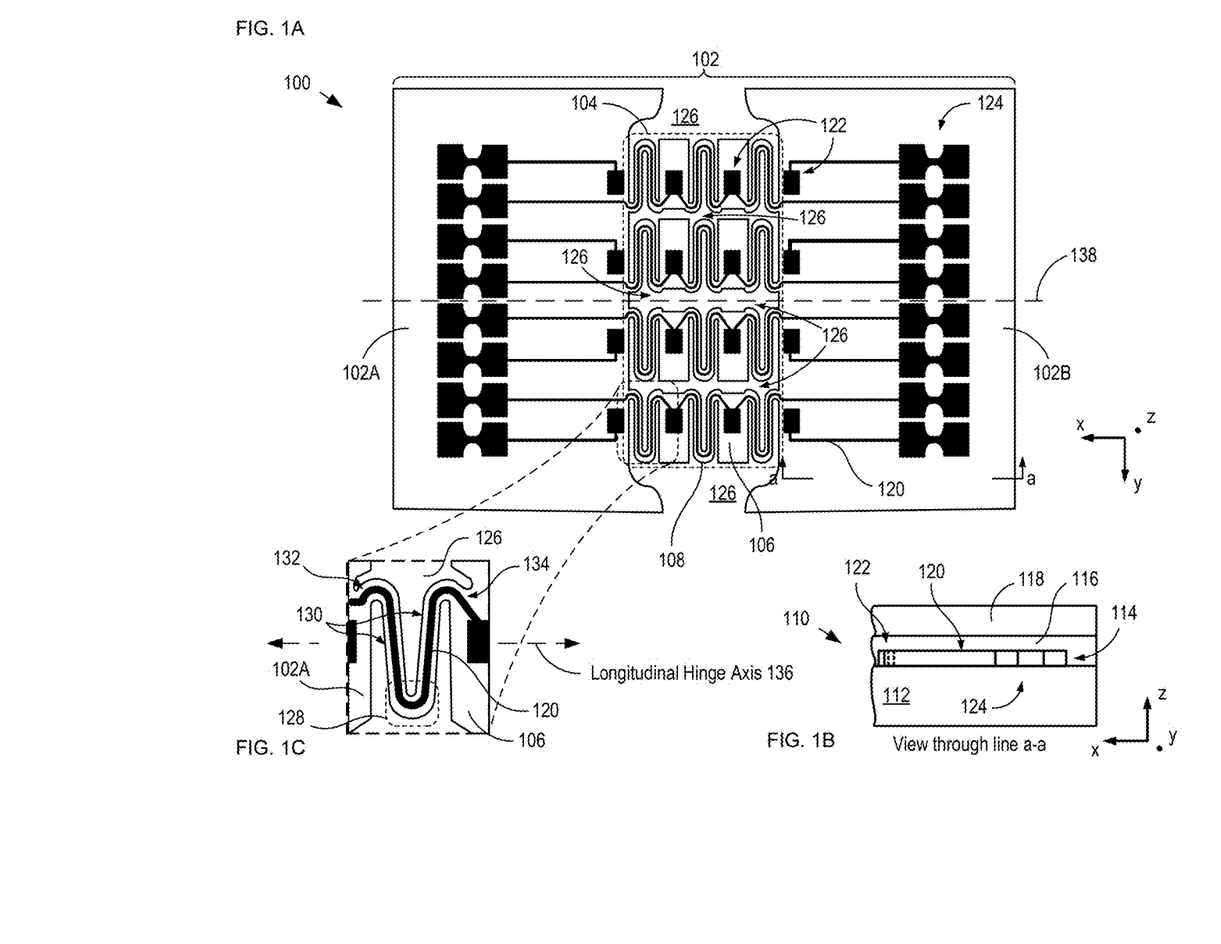
FIG. 1A depicts a schematic drawing of a top view of an actuator in accordance with an illustrative embodiment of the present invention.
FIG. 1B depicts a schematic drawing of the layer structure of actuator 100 in accordance with the illustrative embodiment.
FIG. 1C depicts a schematic drawing of an enlarged view of a hinge region of actuator 100.

FIG. 1A depicts a schematic drawing of a top view of an actuator in accordance with an illustrative embodiment of the present invention. Actuator 100 comprises frame 102 and actuation region 104. Actuation region 104 includes islands 106 and hinges 108.

Actuator 100 is a purely mechanical actuator that generates motion and force in the z-direction in response to a lateral strain applied to the actuator along the x-direction. When actuator 100 is in its quiescent (i.e., unstrained) state, frame 102, islands 106, and hinges 108 lie flat such that they are coplanar in the x-y plane. When actuator 100 is strained along the x-direction, however, islands 106 rotate out of plane such that they project above and below the x-y plane. The amount of strain required to induce rotation of islands 106, as well as the amount of force the islands can generate, are matters of actuator design, as discussed below and with respect to FIGS. 2-7.

FIG. 1B depicts a schematic drawing of a side view of a portion of actuator 100. Actuator 100 is characterized by laminated structure 110, which comprises base layer 112, trace layer 114, adhesive layer 116, and cover layer 118. In some embodiments, actuator 100 is formed using flex-circuit fabrication methods.

Base layer 112 is a layer of polyimide having a thickness of approximately 50 microns.

Trace layer 114 is a layer of ductile material that is formed on base layer 112 in conventional fashion. In the illustrative embodiment, trace layer comprises highly ductile copper;

however, one skilled in the art will recognize that many materials are suitable for use in trace layer 114, such as other metals, elastomers, polymers, rubbers, and the like. Trace layer 114 has a thickness of approximately 12.5 microns. Trace layer 114 is patterned in conventional fashion to define traces 120, electrodes 122, and bond pads 124. In some embodiments, trace layer 114 is patterned prior to being bonded to base layer 112.

Adhesive layer 116 is disposed over trace layer 114 such that it has a thickness of approximately 15 microns. Adhesive layer facilitates the bonding of base layer 112 and cover layer 118. In some embodiments, adhesive layer 116 is not included in laminated structure 110.

Cover layer 118 is a cap layer of polyimide that is formed over trace layer 114 and adhesive layer 116. Cover layer 118 has a thickness of approximately 12.5 microns. Cover layer 118 and base 112 collectively encapsulate the structure of actuator 100 making it suitable for implantation in biological matter, such as the body of a human or animal. In some embodiments, cover layer 118 is not included in laminated structure 110.

One skilled in the art will recognize that the materials and thicknesses provided here for actuator 100 are merely exemplary and that myriad alternative materials and layer thicknesses can be included in the structure of actuator 100 without departing from the scope of the present invention. Further, although flex-circuit technology affords embodiments of the present invention advantages in some applications, it will be clear to one skilled in the art, after reading this Specification, that fabrication methods and material systems other than flex-circuit technology (e.g., conventional surface micromachining, reel-to-reel manufacturing, etc.) can be used to fabricate devices in accordance with the present invention. Materials suitable for use in any layer of embodiments of the present invention include, without limitation, silicon, silicone, Parylene, polymers (e.g., thermoplastics, thermosets, elastomers, etc.), polyimides, metals, composite materials, and the like.

Once fully formed, laminated structure 110 is patterned in conventional fashion to define perforations 126, which define frame 102, islands 106, and hinges 108. Processes suitable for patterning laminated structure 110 include, without limitation, laser cutting, stamping, die cutting, reactive-ion etching, wet chemical etching, and the like. One skilled in the art will recognize that the method of forming perforations 126 depends on the materials included in actuator 100.

In addition to defining frame 102, islands 106, and hinges 108, perforations 126 enable axial stretching of actuator 100 along the x-direction. Typical polyimides are not significantly elastic, having a tensile strength in the range of 150 MPa and a failure strain of approximately 40-50%. As a result, perforations 126 are necessary to enable actuator 100 to exhibit large strains. Perforations 126 also allow actuator 100 to conform to a non-planar surface, if desired.

Frame 102 is a mechanical structure that surrounds actuator 100 and facilitates its handling. In some embodiments, frame 102 also provides attachment points for a linear actuator used to induce strain in actuator 100. Frame 100 includes two frame halves 102A and 102B.

Each of islands 106 is a region of laminated structure 106 suitable for receiving another device. Devices suitable for mounting on islands 106 include, without limitation, electronic devices, electromechanical devices, electro-optic devices, passive optical devices, mirrors, micromechanical devices, sensors, chemical sensors, biosensors, biomarker chips, and the like. In some embodiments, islands 106 substantially isolate devices integrated on them from strain applied to actuator 100.

Although the illustrative embodiment comprises islands that are substantially rectangular, it will be clear to one skilled in the art, after reading this Specification, how to make and use alternative embodiments of the present invention that comprise islands having any practical shape. Shapes suitable for use as islands include, without limitation, squares, rectangles, circles, ellipses, triangles, polygons, and irregular shapes.

Hinges 108 are analogous to strain-relief regions disclosed in U.S. Patent Publication 20100330338; however, hinges 108 are designed to give rise to an out-of-plane rotational force on islands 106 when subjected to in-plane strain. As discussed below, the rate of island rotation and the in-plane strain threshold at which it begins depend upon the design of hinges 108.

FIG. 1C depicts a schematic drawing of an enlarged view of a hinge region of actuator 100. Each of hinges 108 is a substantially serpentine element that includes curve 128 and two straight portions 130 between first end 132 and second end 134. Hinge 108 is designed to accommodate strain along the longitudinal hinge axis 136 by bending in curve 128 and by rotation of arms 130. As a result, in response to a longitudinal strain (i.e., a strain along longitudinal hinge axis 136), hinge 108 generates a rotational force on second end 134 (since first end 132 is fixed at frame half 102A in FIG. 1C), and, in turn, on the island to which second end 134 is mechanically attached. In the illustrative embodiment, the design parameters of hinge 108 (e.g., the length of arms 130, hinge width, bend radius of curve 128, and thickness of trace 120, among others) are designed to be within fabrication capabilities of flex circuit vendors.

Traces 120 are electrically conductive and electrically connect electrodes 122, located on islands 106, with bond pads 124, located on frame halves 102A-B.

Each of electrodes 122 is a 305 micron-square region of copper. Electrodes 122 are arranged on islands 106 such that they form a regular 2×2 array having a pitch of 1.4 mm in each of the x- and y-dimensions.

Bond pads 124 are conventional bond pads suitable for enabling electrical connection between actuator 100 and external electronics.

Although the illustrative embodiment includes traces that are electrically conductive, in some embodiments, hinges 108 are not configured to provide electrical connectivity between islands 106 and frame halves 102A-B.

Islands 106 and hinges 108 are defined such that they form a "daisy chain" configuration, wherein each island is mechanically connected between a pair of hinge sets. Each hinge set in actuator 100 includes four hinges 108. In some embodiments, at least one hinge set contains a single hinge. In some embodiments, at least one hinge set contains a plurality of hinges having more or less than four hinges.

Although the illustrative embodiment comprises a plurality of islands and a plurality of hinges, it will be clear to one skilled in the art, after reading this Specification, how to specify, make, and use alternative embodiments of the present invention that comprise a single island and as few as two hinges.

Figure 2A:
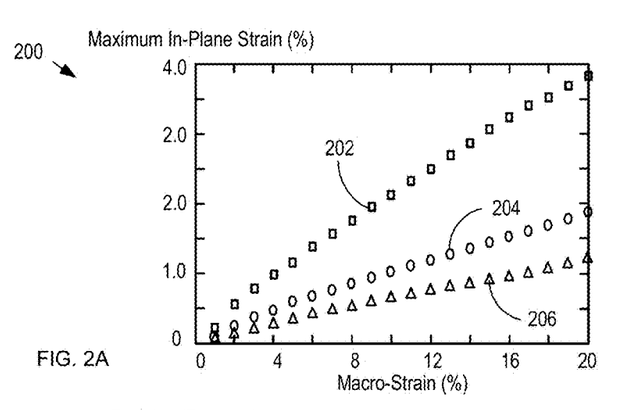
FIG. 2A depicts simulations of the relationship between the in-plane strain induced in trace 120 and the macroscopic strain applied to actuator 100 for different designs of hinge 108.

FIG. 2A depicts simulations of the relationship between the in-plane strain induced in trace 120 and the macroscopic strain applied to actuator 100 for different designs of hinge 108. Plot 200 depicts results for hinge designs having short arms 130 (hinge design 202), medium length arms 130 (hinge design 204), and long arms 130 (hinge design 206).

The length of arms 130 in hinge designs 202, 204, and 206 are approximately 0.6 mm, 1.1 mm, and 1.7 mm, respectively.

It can be seen from plot 200 that peak, in-plane principal strain in trace 120 increases linearly with the strain applied to the actuator for all hinge designs. The rate of increase decreases as arm length increases, however.

Figure 2B:
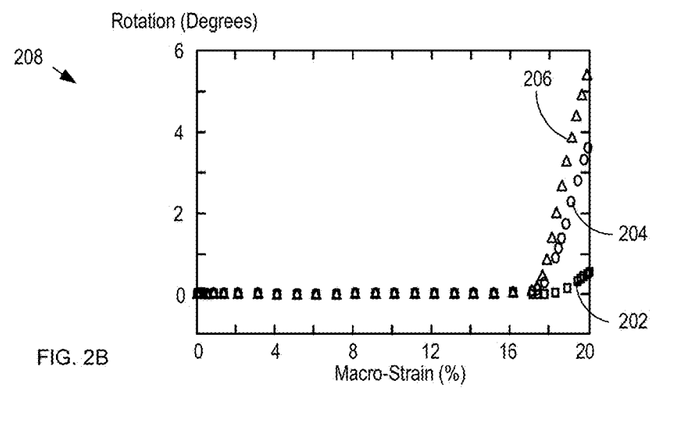
FIG. 2B depicts simulations of the relationship between out-of-plane rotation and macroscopic strain applied to actuator 100 for different designs of hinge 108.

FIG. 2B depicts simulations of the relationship between out-of-plane rotation and macroscopic strain applied to actuator 100 for different designs of hinge 108.

As mentioned above, hinge 108 is designed to accommodate strain along the x-direction by bending in curve 128 and rotation of arms 130. Plot 208 shows that arm rotation increases with arm length for hinge designs 202-206. At any given level of applied macroscopic strain, a longer arm 130 accommodates more of the applied strain by arm rotation. As a result, longer arms mitigate development of strain in trace 120.

Plot 208 also predicts that each of the three hinge designs exhibits minimal out-of-plane rotation for macroscopic strains less than 17%. In other words, hinge designs 202-206 are characterized by a strain threshold of approximately 17%, at which rotation of islands 106 begins. Plot 208 also shows that rotation rate increases with the length of arm 130. It should be noted that, in addition to arm length, the operational behavior of hinge 108 is also dependent upon other ratios between some or all of its tunable design parameters, such as the ratio of arm length to flex-circuit thickness, etc.

In some embodiments, such as the illustrative embodiment, it is desired that hinges 108 provide electrical connectivity between islands 106 and frame 102. As a result, trace 120 comprises an electrically conductive material (i.e., copper). In such embodiments, it is often desirable to limit the development of strain within the electrically conductive material to mitigate reliability issues.

It should be noted that, in actuator 100, hinges 108 are arranged such that they have mirror symmetry about axis 138, which runs through the center of actuator 100. The symmetric arrangement of hinges 108 mitigates in-plane rotation (i.e., about the z-axis) of islands 106 when a macroscopic strain is applied to actuator 100. In some embodiments, biaxial operation is desired and hinges 108 are arranged in a non-symmetric arrangement about axis 138.

Figure 3A:
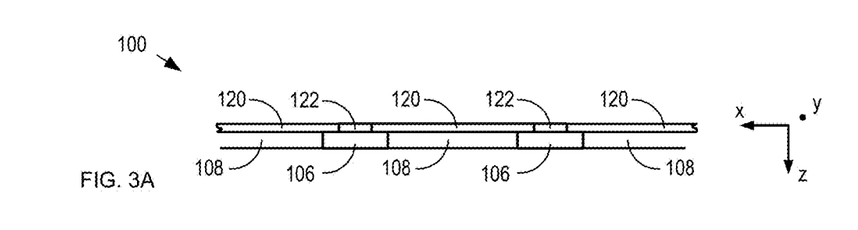
FIGS. 3A and 3B depict schematic drawings of a side view of a portion of actuator 100, before and after rotation of islands 106, respectively, in accordance with the illustrative embodiment of the present invention.
Figure 3B:
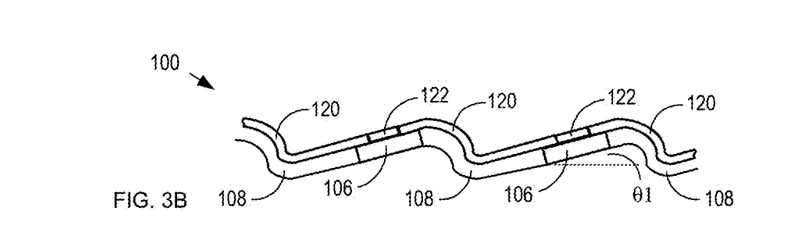

FIGS. 3A and 3B depict schematic drawings of a side view of a portion of actuator 100, before and after rotation of islands 106, respectively, in accordance with the illustrative embodiment of the present invention. In should be noted that, for clarity, FIGS. 3A and 3B do not show adhesive layer 116 and cap layer 118, or the regions of base layer 112 between islands 106 and frame 102.

As shown in FIG. 3A, prior to application of macroscopic strain to actuator 100, islands 106 are substantially coplanar and are parallel in the x-y plane.

As shown in FIG. 3B, application of macroscopic strain to actuator 100 causes out-of-plane deformation of hinges 108, which thereby induce islands 106 to rotate about the y-axis to angle, θ1. It should be noted that, in some embodiments, one or more of islands 106 also translates along the x-direction as actuator 100 stretches to accommodate applied macroscopic strain.

As depicted in plot 208 described above and with respect to FIG. 2B, when applied macroscopic strain exceeds approximately 17%, island 106 begins to exhibit out-of-plane rotation. As noted, the rate at which island 106 is dependent upon the specific design of hinge 108. For example, hinge design 202 (which has approximately 0.6 mm-long arms 130) rotates island 106 at a rate of approximately 0.25° per 1% strain, hinge design 204 (which has approximately 1.1 mm-long arms 130) rotates island 106 at a rate of approximately 1.2° per 1% strain, while hinge design 206 (which has approximately 1.7 mm-long arms 130) rotates island 106 at a rate of approximately 1.8° per 1% strain.

Figure 3C:
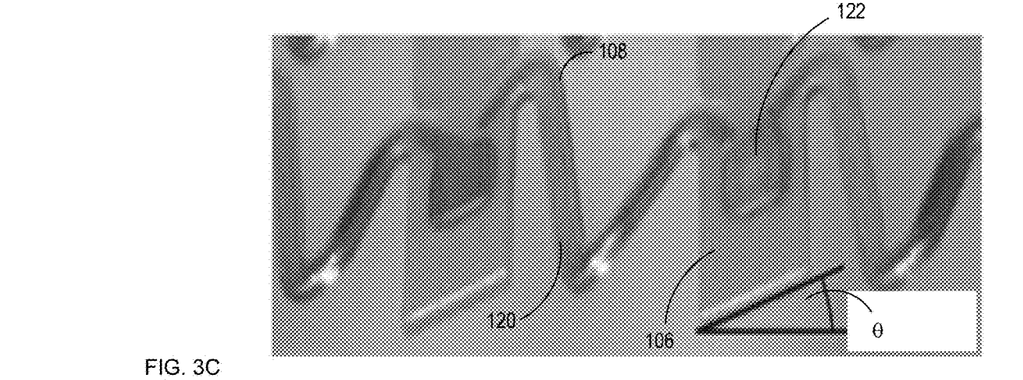
FIG. 3C depicts a photograph of a perspective view of a portion of an actuator in accordance with the illustrative embodiment of the present invention after rotation of islands 106.

FIG. 3C depicts a photograph of a perspective view of a portion of an actuator in accordance with the illustrative embodiment of the present invention after rotation of islands 106.

It should be noted that the out-of-plane behavior depicted in FIGS. 3A-C is reversible. In some embodiments of the present invention, however, irreversible out-of-plane behavior is provided by including features that undergo a permanent or semi-permanent deformation, such as a latching mechanism, a bi-stable configuration, or plastic deformation, so that the deformation remains after the macroscopic strain on the device is removed.

Figure 4:
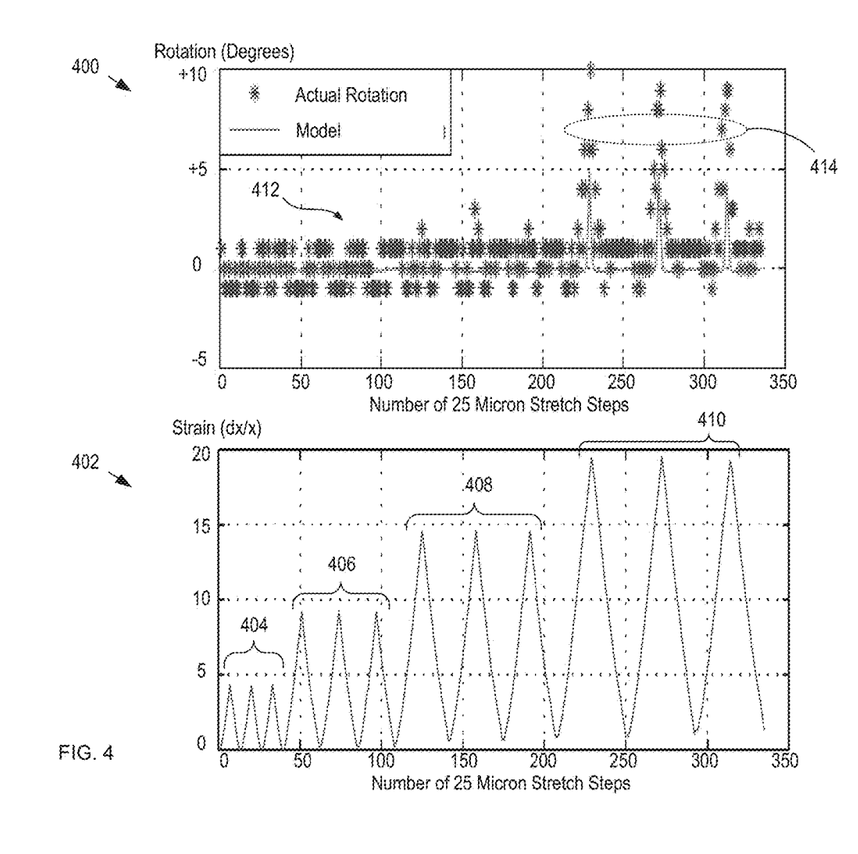
FIG. 4 depicts plots of the rotation and induced macroscopic strain in actuator 100 as a function of stretch steps performed during cyclic testing of an actuator in accordance with the illustrative embodiment of the present invention.

FIG. 4 depicts plots of the rotation and induced macroscopic strain in actuator 100 as a function of stretch steps performed during cyclic testing of an actuator in accordance with the illustrative embodiment of the present invention.

Three cycles of strain were applied to actuator 100 at each of approximately 4%, 10%, 14%, and 20% (strain peaks 404, 406, 408, and 410). For strains at or below 14%, no significant rotation of island 106 was observed, as indicated in trace 412 of plot 400. At each of the three cycles of applied 20% strain (strain peaks 410), however, repeatable rotation of approximately 10° is observed (peaks 414 of plot 400).

Figure 5:
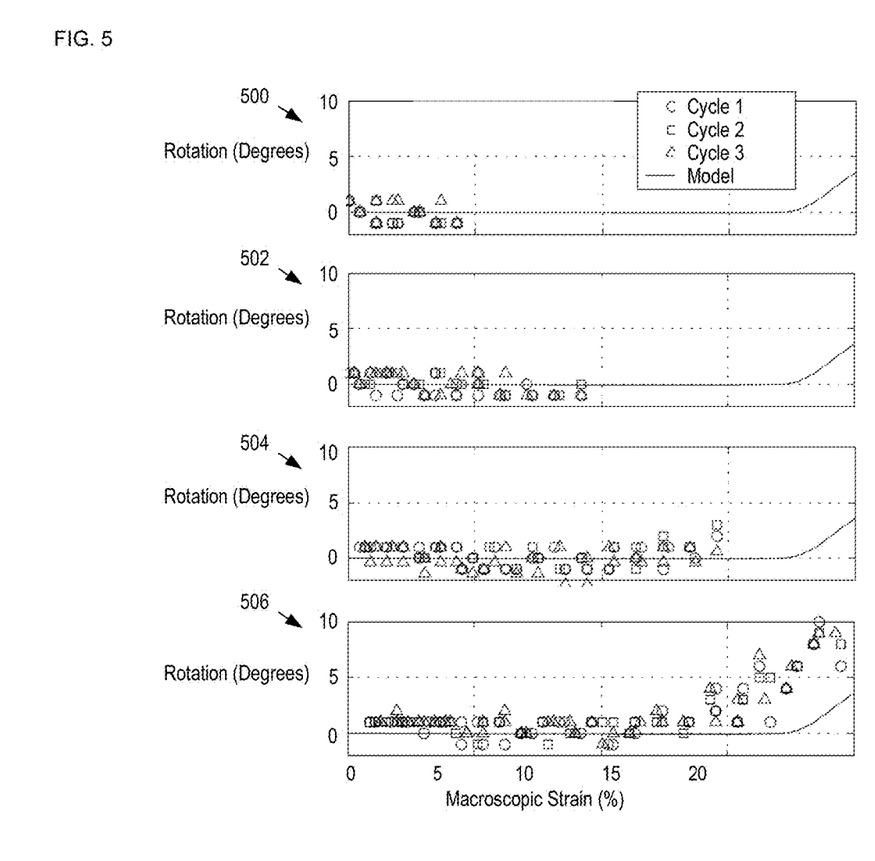
FIG. 5 depicts plots of island rotation as a function of applied macroscopic strain for cyclic testing of actuator 100.

FIG. 5 depicts plots of island rotation as a function of applied macroscopic strain for cyclic testing of actuator 100. Plots 500, 502, 504, and 506 show measured and simulated island position for applied strains within the ranges of 0 to 5%, 0 to 10%, 0 to 15%, and 0 to 20%, respectively.

It is readily observed from plots 500-506 that rotation of island 106 does not begin until macroscopic strain reaches approximately 15%.

It is an aspect of the present invention that the design of hinge 108 dictates both the rate of island rotation in response to applied macroscopic strain, as well as the macroscopic strain threshold at which an island 106 begins out-of-plane rotation. Further, by including different hinge designs in the same actuator, different islands can be afforded different macroscopic strain thresholds and/or different rates of out-of-plane rotation.

Figure 6:
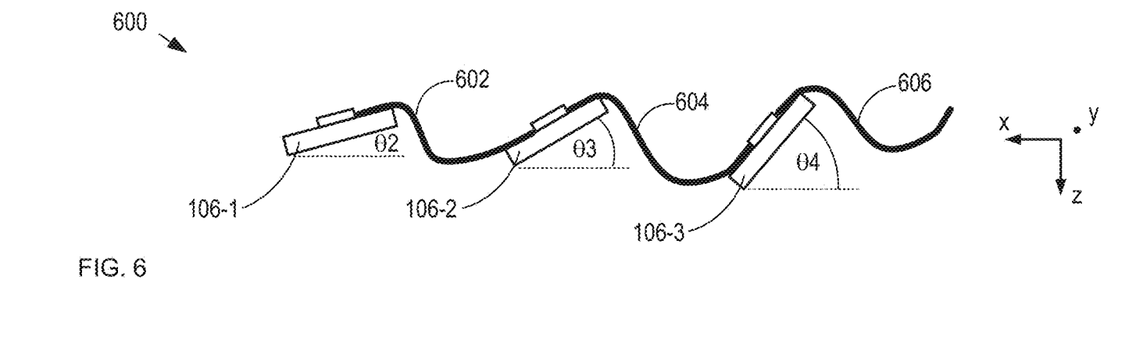
FIG. 6 depicts a schematic drawing of a side view of an actuator, after actuation by an applied strain, in accordance with a first alternative embodiment of the present invention.

FIG. 6 depicts a schematic drawing of a side view of an actuator, after actuation by an applied strain, in accordance with a first alternative embodiment of the present invention. Actuator 600 comprises islands 106-1, 106-2, and 106-3 and hinges 602, 604, and 606.

Each of hinges 602, 604, and 606 is hinge having a different design (e.g., arm length, material layer thicknesses), such that it actuates at a different rate when sufficient strain is applied to actuator 600. For example, hinge 602 induces a rotation angle of θ2 on island 106-1, hinge 604 induces a rotation angle of θ3 on island 106-2, hinge 606 induces a rotation angle of θ4 on island 106-3.

In some embodiments, the different rates of rotation for islands 106-1 through 106-3 enable each island to exert a different amount of force when actuated.

Furthermore, the amount of force exerted on another object by any one of the islands can be controlled through hinge design and/or the amount of macroscopic strain applied to actuator 700.

Figure 7A:
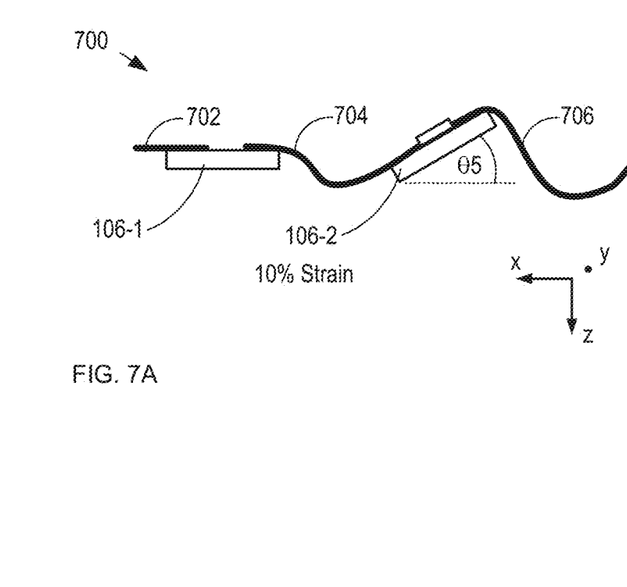
FIGS. 7A and 7B depict schematic drawings of side view of an actuator, at different levels of applied strain, in accordance with a second alternative embodiment.
Figure 7B:
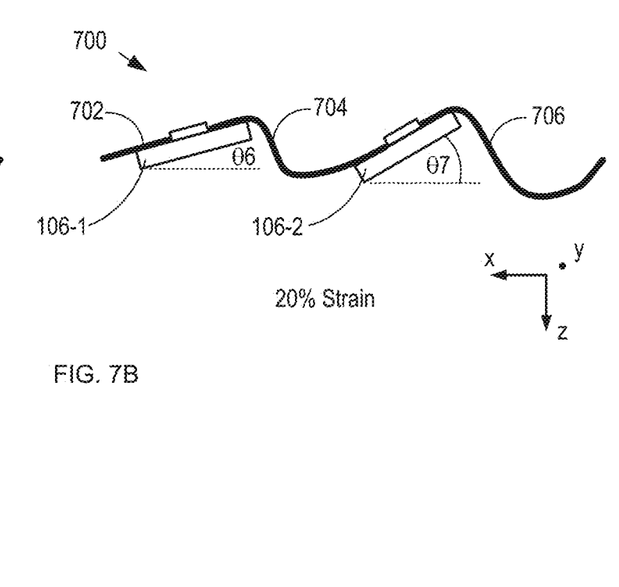

FIGS. 7A and 7B depict schematic drawings of side view of an actuator, at different levels of applied strain, in accordance with a second alternative embodiment. Actuator 700 comprises islands 106-1 and 106-2 and hinges 702, 704, and 706.

Each of hinges 702, 704, and 706 is designed such that it actuates at a different level of macroscopic strain applied to actuator 700. As a non-limiting example, hinges 704 and 706 give rise to a rotation of island 106-2 to rotation angle θ5 when the applied strain is equal to or greater than 10%, while hinges 702 and 704 give rise to a rotation of island 106-1 to rotation angle θ6 only after the applied strain meets or exceeds 20%. At a 20% applied strain, the rotation angle of island 106-2 increases to θ7.

It is another aspect of the present invention that different hinge designs can be combined in one or more actuators to form more complicated mechanical systems, such as grippers, spatial-light modulators, linear positioning systems (e.g., micro conveyer systems, etc.), tactile feedback systems, and the like.

Figure 8A:
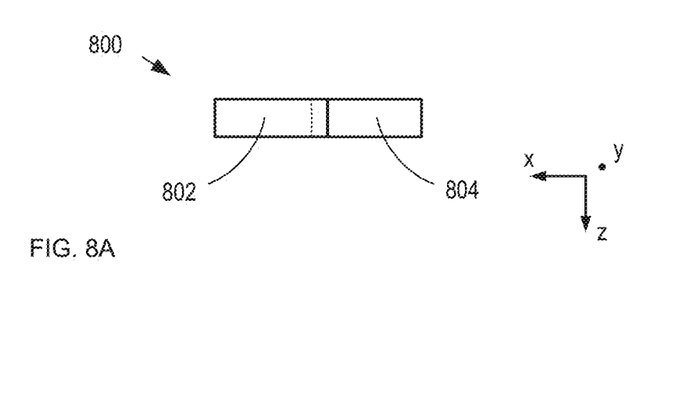
FIGS. 8A and 8B depict schematic drawings of a gripper, before and after actuation by an applied strain, respectively, in accordance with a third alternative embodiment of the present invention.
Figure 8B:
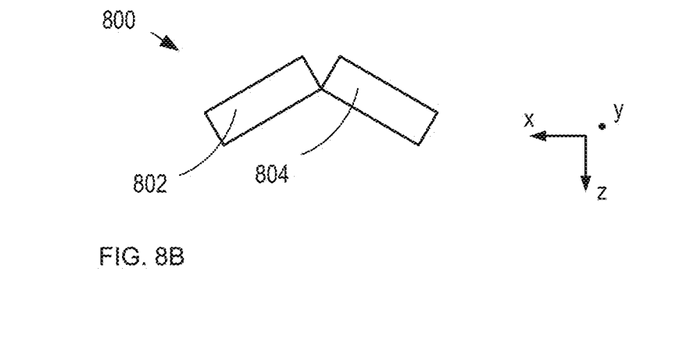

FIGS. 8A and 8B depict schematic drawings of a gripper, before and after actuation by an applied strain, respectively, in accordance with a third alternative embodiment of the present invention. Actuator 800 comprises islands 802 and 804 and a plurality of hinges 108 (not shown for clarity), which are arranged to enable opposing rotation of islands 802 and 804.

Islands 802 and 804 are designed to nest together such that they can lie in a single plane when in their unactuated state. When actuated however, islands 802 and 804 come into close proximity (or into contact) such that they can collectively grip another object, such as a DNA strand, blood cell, etc.

Figure 9A:
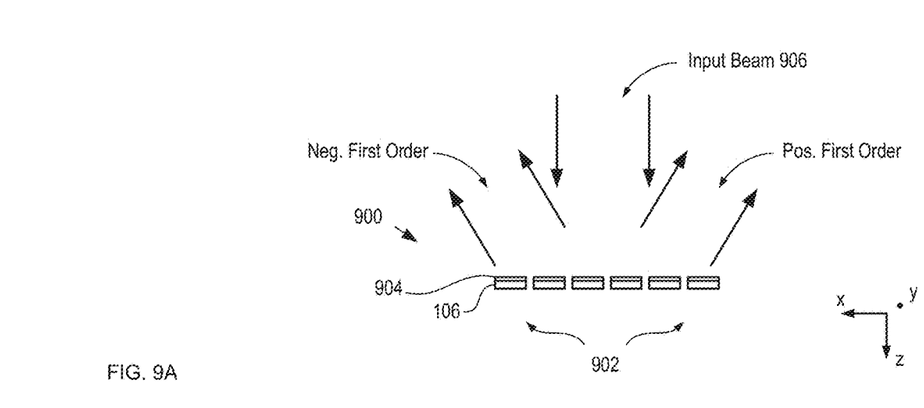
FIGS. 9A-B depict schematic drawings of a side view of a tunable optical element, before and after actuation, respectively, in accordance with a fourth alternative embodiment of the present invention.
Figure 9B:
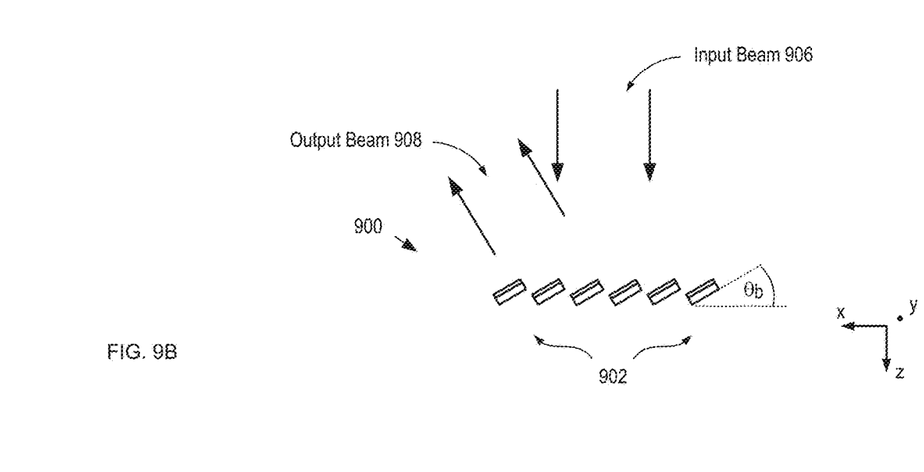

FIGS. 9A-B depict schematic drawings of a side view of a tunable optical element, before and after actuation, respectively, in accordance with a fourth alternative embodiment of the present invention. Variable blazed grating 900 comprises a plurality of islands 902 and a plurality of hinges 108 (not shown for clarity), which are arranged to rotate at the same rate and in the same direction.

Each of islands 902 includes surface 904, which is a first-surface reflector that is reflective for input beam 906. In some embodiments, at least one of islands 902 includes a different optical surface (e.g., such as a prism, dielectric mirror, refractive lens, diffractive lens, diffraction grating, optical filter, wavelength filter, etc.). Islands 106 and their respective optical elements collectively define a tunable optical system.

Prior to actuation, islands 902 lie in the same plane and collectively define a conventional diffraction grating. As a result, in its unactuated (i.e., quiescent) state, actuator 900 diffracts the optical energy of input beam 906 into a plurality of positive and negative diffraction orders (only the first diffraction order is shown in FIG. 9A).

After actuation, islands 902 are oriented at blaze angle, $\theta_b$, for variable blaze grating 900. One skilled in the art will recognize that the value of the blaze angle for blazed grating 900 is based on the wavelength of light in input beam 906, and the size and periodicity of islands 902. As a result, variable blazed grating 900 directs the majority of the optical energy of input beam 906 into a single output beam (i.e., output beam 908).

Figure 10A:
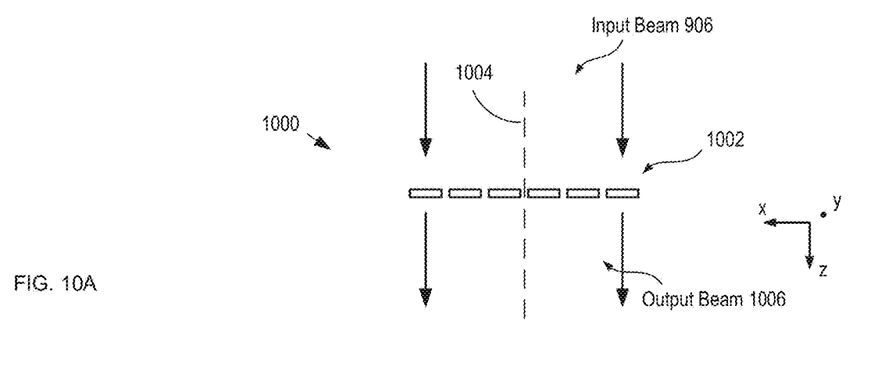
FIGS. 10A-B depict schematic drawings of a side view of a tunable optical element, before and after actuation, respectively, in accordance with a fifth alternative embodiment of the present invention.
Figure 10B:
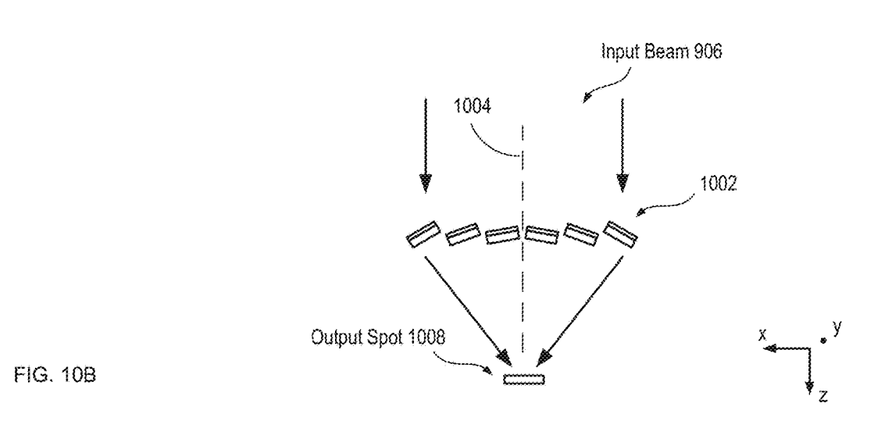

FIGS. 10A-B depict schematic drawings of a side view of a tunable optical element, before and after actuation, respectively, in accordance with a fifth alternative embodiment of the present invention. Variable Fresnel lens 1000 comprises islands 1002 and a plurality of hinges 108 (not shown for clarity), which are arranged in groups characterized by opposing rotation direction about axis 1004. In addition, islands 1002 and hinges 108 give rise to a rotation of the islands that is based on the desired optical characteristics of Fresnel lens 1000 when actuated.

Islands 1002 are analogous to islands 106 described above and with respect to FIG. 1; however, islands 1002 include regions suitable for forming lens regions.

In its unactuated state, variable Fresnel lens 1000 allows the optical energy in input beam 906 to pass through islands 1002 without refraction or diffraction.

In its actuated state, however, islands 1002 collectively form a Fresnel lens that focuses input beam 906 into a substantially diffraction-limited spot (i.e., output spot 1008).

Figure 11A:
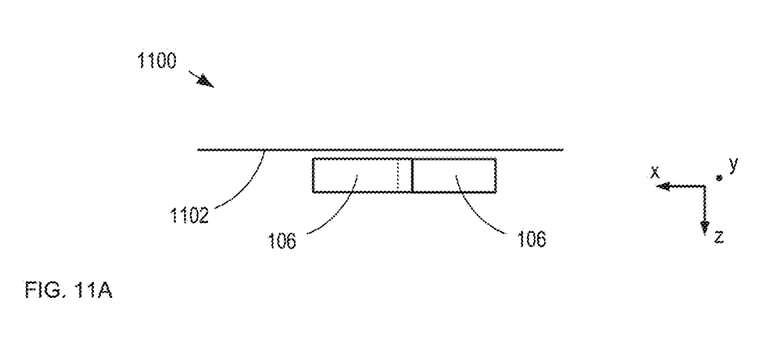
FIGS. 11A and 11B depict schematic drawings of a side view of a vertical actuator, before and after actuation, respectively, in accordance with a sixth alternative embodiment of the present invention.
Figure 11B:
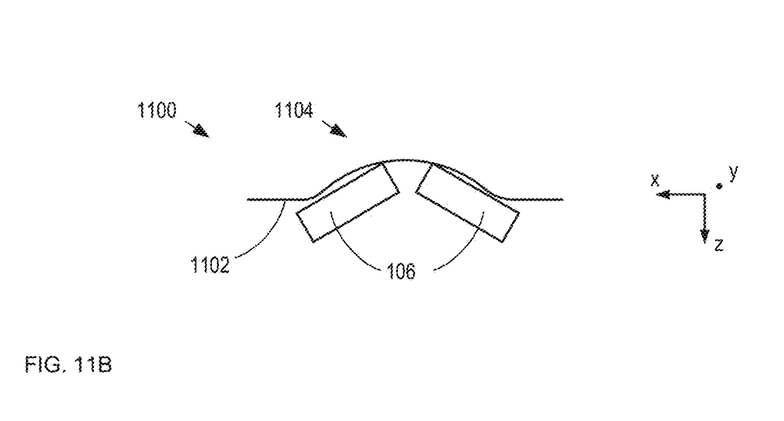

FIGS. 11A and 11B depict schematic drawings of a side view of a vertical actuator, before and after actuation, respectively, in accordance with a sixth alternative embodiment of the present invention. Tactile display element 1100 is an element of a tactile feedback array suitable for use in haptic systems, braille displays, adaptable-friction surfaces, and the like. Element 1100 comprises islands 106, a plurality of hinges 108 (not shown for clarity), and membrane 1102.

Membrane 1102 is a substantially continuous sheet of resilient material. In some embodiments, membrane 1102 is substantially reflective for an electromagnetic signal (e.g., light, microwave energy, x-rays, etc.).

In its unactuated state, membrane 1102 is substantially flat and smooth.

When appropriate strain is applied to actuator 1100, islands 106 rotate to induce a deflection of membrane 1102 such that its surface comprises projection 1104. In some embodiments, the membrane region above islands 106 is formed with a mechanically bi-stable state. In such embodiments, projection 1104 is latched after actuation such that it remains deflected even after the removal of strain from actuator 1100.

Embodiments of the present invention in accordance with actuator 1100 are suitable for applications such as deformable mirrors, tactile-feedback systems, tunable-pressure vessels, etc.

Figure 12:
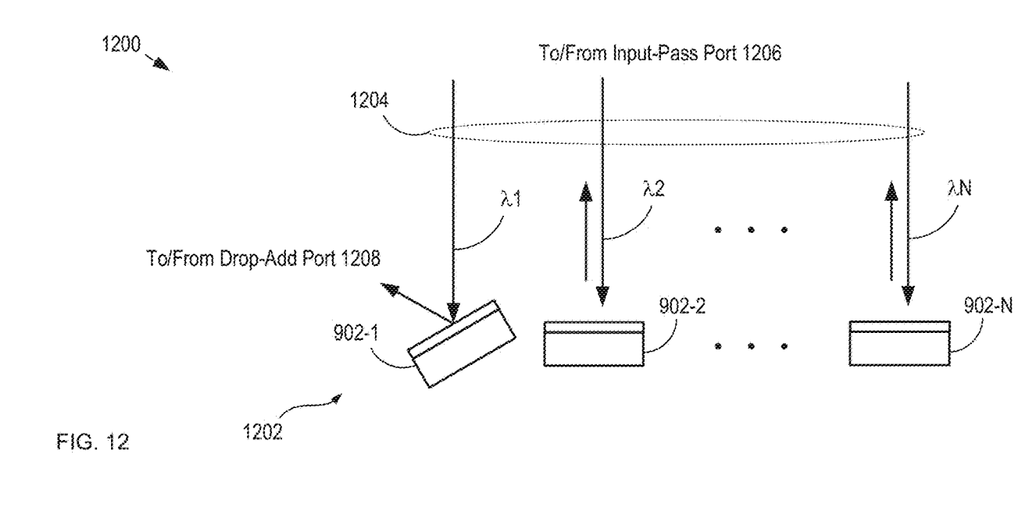
FIG. 12 depicts a schematic drawing of a side view of an actuator, after actuation by an applied strain, in accordance with a seventh alternative embodiment of the present invention.

FIG. 12 depicts a schematic drawing of a side view of an actuator, after actuation by an applied strain, in accordance with a seventh alternative embodiment of the present invention. Reconfigurable optical add-drop multiplexer (ROADM) 1200 comprises mirror array 1202, input-pass port 1206, and drop-add port 1208.

Mirror array 1202 comprises a plurality of N islands 902 and a plurality of hinges 108 (not shown for clarity). The rotation angle of each of islands 902-1 through 902-N is independently controllable.

In operation, each island 902 receives a different wavelength contained in optical signal 1204 and directs it to either input-pass port 1206 or to drop-add port 1208. For example, FIG. 12 depicts island 902-1 directing wavelength λ1 to drop-add port 1208, while wavelengths λ2 through λN are directed back to input-pass port 1206 by islands 902-2 through 902-N, respectively.

It should be noted that mirror array 1202 is suitable for applications other than wavelength switching, such as white-light, free-space optical switching, optical beam steering, x-ray beam steering, controllable electromagnetic beam deflectors, steerable mirrors, and the like.

Figure 13:
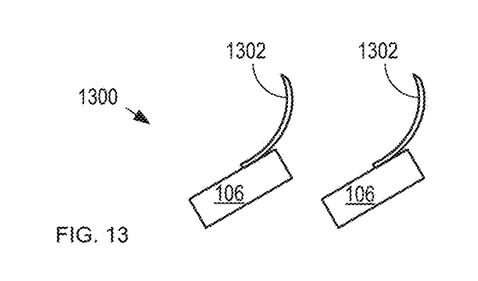
FIG. 13 depicts a schematic drawing of a side view of an adhesion device, after actuation, in accordance with an eighth alternative embodiment of the present invention.

FIG. 13 depicts a schematic drawing of a side view of an adhesion device, after actuation, in accordance with an eighth alternative embodiment of the present invention. Adhesion element 1300 comprises islands 106, a plurality of hinges 108 (not shown for clarity), and barbs 1302.

When islands 106 rotate in response to an applied strain, barbs 1302 extend beyond the end of their respective island. As a result, islands 106 can be rotated so as to drive barbs 1302 into an external object or surface, such as the wall of an artery, other biological matter, and the like.

In some embodiments, end effecters 1302 include different features that facilitate interaction with an external object or surface (e.g., hooks, electrodes, etc.).

Embodiments of the present invention in accordance with actuator 1300, with or without electrical conductivity, are suitable for applications such as, without limitation, stretchable biosensors, wearable electronics, electrical switching elements, microbuttons, grippers, and stealthy sensors.

It should be noted that some embodiments of the present invention are well suited for enhancing contact force between external objects and/or surfaces, or between an object on the surface of an island and an external object or surface. As a result, embodiments of the present invention are capable of improving thermal and/or electrical conductivity between such objects and/or surfaces.

It is to be understood that the disclosure teaches just one example of the illustrative embodiment and that many variations of the invention can easily be devised by those skilled in the art after reading this disclosure and that the scope of the present invention is to be determined by the following claims.

What is claimed is:

1. An apparatus comprising an actuator having a first end and a second end, wherein the actuator includes:
   a first island that is substantially rigid;
   a first hinge that is mechanically coupled between the first end and the first island;
   a second hinge that is mechanically coupled between the second end and the first island;
   a second island that is substantially rigid; and
   a third hinge that is mechanically coupled with each of the first island and the second island, wherein the third hinge is between the first island and second island;
   wherein the actuator is configured such that:
   (A) when the actuator is in its quiescent state, (i) the first end and second end are separated by a first separation that has a first magnitude, (ii) the first end, second end, first hinge, second hinge, first island, second island, and third hinge are co-planar in the first plane, and (iii) the first and third hinges are substantially strain-free; and
   (B) when the actuator is in an actuated state, (i) the first end and second end are separated by a second separation that gives rise to a macro-strain in the actuator and (ii) the first hinge generates a first force on the first island based on the macro-strain and the third hinge generates a second force on the second island, wherein the first and second forces are directed out of the first plane.

2. The apparatus of claim 1 wherein the first hinge is configured such that it generates the first force only when the first strain is equal to or greater than a first threshold level.

3. The apparatus of claim 1 wherein the first hinge is dimensioned and arranged to generate the first force only when the first strain is equal to or greater than a first threshold level, and wherein the third hinge is dimensioned and arranged to generate the second force only when the second strain is equal to or greater than a second threshold level.

4. The apparatus of claim 3 wherein the first threshold level and the second threshold level are unequal.

5. The apparatus of claim 1 wherein the actuator is dimensioned and arranged such that the first force has a first magnitude and the second force has a second magnitude when the first separation has the second magnitude.

6. The apparatus of claim 1 wherein the first hinge is electrically conductive.

7. The apparatus of claim 1 wherein the first island comprises an optical element.

8. The apparatus of claim 1 wherein the first island comprises an end effector.

9. An apparatus comprising an actuator that includes:
   a first island that defines a first plane;
   a first hinge having a first end and a second end that is connected to the first island, the first hinge having a first arm, a first curve, and a second arm that are serially connected between the first end and the second end;
   a second island that defines a second plane; and
   a second hinge having a third end and a fourth end that is connected to the second island, the second hinge having a third arm, a second curve, and a fourth arm that are serially connected between the third end and the fourth end;
   wherein the actuator is configured such that it has an unactuated state and an actuated state, and wherein:
   (A) when the actuator is in the unactuated state, (i) the first end and second end are separated by a first separation in the first plane, (ii) the third end and fourth end are separated by a second separation in the second plane, (iii) the first island and first hinge are coplanar in the first plane, and (iv) the second island and second hinge are coplanar in the second plane; and
   (B) when the actuator is in the actuated state, (i) the first end and second end are separated by a third separation in the first plane that is greater than the first separation, (ii) the first hinge has a first longitudinal strain that exceeds a first threshold and the first hinge imparts a first force on the first island, the first force being directed out of the first plane, (iii) the third end and second end are separated by a fourth separation that is greater than the second separation, and (iv) the third hinge has a second longitudinal strain that exceeds a second threshold and the third hinge imparts a second force on the second island, the second force being directed out of the second plane.

10. The apparatus of claim 9 wherein the first threshold level and the second threshold level are unequal.

11. The apparatus of claim 9 further comprising a third hinge having a fifth end that is connected to the first island and a sixth end that is connected to the second island, the third hinge having a fifth arm, a third curve, and a sixth arm that are serially connected between the fifth end and the sixth end, wherein the first island, second island, first hinge, second hinge, and third hinge are coplanar within the first plane when the actuator is in an unactuated state, and wherein the third hinge is dimensioned and arranged such that an increase in a third separation between the fifth and sixth ends generates a third longitudinal strain in the third hinge that gives rise to a rotation of at least one of the fifth arm and sixth arm out of the first plane when the third longitudinal strain exceeds a third threshold;
   wherein the first hinge, first island, second island, second hinge, and third hinge are serially connected as a first chain such that a first macroscopic strain applied to the first chain gives rise to the first longitudinal strain, the second longitudinal strain, and the third longitudinal strain.

12. The apparatus of claim 9 wherein the first hinge is operative for rotating the first island out of the first plane by a first magnitude when the first longitudinal strain is greater than the first threshold, and wherein the second hinge is operative for rotating the second island out of the second plane by a second magnitude when the second longitudinal strain is greater than the second threshold.

13. The apparatus of claim 12 wherein the first plane and the second plane are coplanar.

14. The apparatus of claim 12 wherein the first threshold is equal to the second threshold, and wherein the first magnitude and second magnitude are unequal.

15. The apparatus of claim 12 wherein the first threshold is equal to the second threshold, and wherein the first magnitude and second magnitude are equal.

16. The apparatus of claim 9 wherein the first island comprises an optical element.

17. The apparatus of claim 9 wherein the first island comprises an end effector.

18. A method comprising:
   (A) providing an actuator having a first end and a second end wherein the first end and second end are separated by a first separation in a first plane, and wherein the first separation is controllable, and wherein the actuator includes:
     (i) a first island;
     (ii) a first hinge that is mechanically coupled between the first end and the first island;
     (iii) a second hinge that is mechanically coupled between the second end and the first island; and
     (iv) a second island that defines a second plane;
   wherein the actuator is configured such that:
   (a) when the actuator is in its quiescent state, (1) the first separation has a first magnitude, (2) the first end, second end, first hinge, second hinge, and first island are co-planar in the first plane, and (3) the first hinge is substantially strain-free; and
   (b) when the actuator is in an actuated state, (1) the first end and second end are separated by a second separation that gives rise to a macro-strain in the actuator and (2) the first hinge generates a first force on the first island based on the macro-strain and the second hinge generates a second force on the second island based on the macro-strain, wherein the first force is directed out of the first plane and the second force is directed out of the second plane;
   (B) controlling the first separation.

* * * * *